(12) United States Patent
Li et al.

(10) Patent No.: US 11,830,410 B2
(45) Date of Patent: Nov. 28, 2023

(54) GATE DRIVING UNIT, GATE DRIVING METHOD, GATE DRIVING CIRCUIT AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Wenqiang Li, Beijing (CN); Chuntong Jiang, Beijing (CN); Ling Shi, Beijing (CN); Yipeng Chen, Beijing (CN); Shuai Xie, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/785,742

(22) PCT Filed: Sep. 14, 2021

(86) PCT No.: PCT/CN2021/118263
§ 371 (c)(1),
(2) Date: Jun. 15, 2022

(87) PCT Pub. No.: WO2022/089067
PCT Pub. Date: May 5, 2022

(65) Prior Publication Data
US 2023/0093654 A1    Mar. 23, 2023

(30) Foreign Application Priority Data

Oct. 26, 2020    (CN) .......................... 202011155389.9

(51) Int. Cl.
*G09G 3/20* (2006.01)
*G11C 19/28* (2006.01)
*G09G 3/36* (2006.01)

(52) U.S. Cl.
CPC ... *G09G 3/2092* (2013.01); *G09G 2300/0852* (2013.01); *G09G 2310/0267* (2013.01)

(58) Field of Classification Search
CPC ......... G09G 3/2092; G09G 2310/0267; G09G 2300/0852
See application file for complete search history.

(56) References Cited

U.S. PATENT DOCUMENTS

| 2012/0133392 A1 | 5/2012 | Wang et al. |
| 2015/0243237 A1 | 8/2015 | Li et al. |

(Continued)

FOREIGN PATENT DOCUMENTS

| CN | 102324221 A | 1/2012 |
| CN | 102903323 A | 1/2013 |

(Continued)

OTHER PUBLICATIONS

PCT/CN2021/118263 international search report and written opinion.

*Primary Examiner* — Lin Li
(74) *Attorney, Agent, or Firm* — IPro, PLLC (57) ABSTRACT

The present disclosure provides a gate driving unit, a gate driving method, a gate driving circuit and a display device. The gate driving unit includes a first clock signal end, a second clock signal end, a third clock signal end, a fourth clock signal end, a first output node control circuitry, a second output node control circuitry, a first control node control circuitry and an output circuitry. According to the present disclosure, it is able to provide a gate driving signal (Continued)

for an N-type transistor in an LTPO pixel circuit, and reduce the number of transistors, thereby to provide a narrow bezel.

20 Claims, 6 Drawing Sheets

(56) References Cited

U.S. PATENT DOCUMENTS

| | | |
|---|---|---|
| 2019/0180834 A1 | 6/2019 | Yuan et al. |
| 2019/0325834 A1* | 10/2019 | Feng ................... G09G 3/3648 |
| 2019/0333595 A1* | 10/2019 | Zou ...................... G11C 19/287 |
| 2020/0027516 A1 | 1/2020 | Feng |
| 2021/0166601 A1 | 6/2021 | Shang et al. |
| 2021/0358361 A1 | 11/2021 | Luo et al. |
| 2021/0358366 A1* | 11/2021 | Feng ................... G11C 19/287 |
| 2022/0343841 A1 | 10/2022 | Shang et al. |

FOREIGN PATENT DOCUMENTS

| | | | | |
|---|---|---|---|---|
| CN | 103208251 A | | 7/2013 | |
| CN | 105469736 A | | 4/2016 | |
| CN | 107784977 A | | 3/2018 | |
| CN | 108877682 A | | 11/2018 | |
| CN | 109872673 A | | 6/2019 | |
| CN | 110503913 A | * | 11/2019 | ............... G09G 3/20 |
| CN | 111508433 A | | 8/2020 | |
| CN | 112185297 A | | 1/2021 | |
| IN | 111768733 A | | 10/2020 | |
| WO | 2019218625 A1 | | 11/2019 | |

* cited by examiner

GATE DRIVING UNIT, GATE DRIVING METHOD, GATE DRIVING CIRCUIT AND DISPLAY DEVICE

CROSS-REFERENCE TO RELATED APPLICATION

This application is the U.S. national phase of PCT Application No. PCT/CN2021/118263 filed on Sep. 14, 2021, which claims Chinese priority No. 202011155389.9 filed on Oct. 26, 2020, the disclosure of which are incorporated in their entirety by reference herein.

TECHNICAL FIELD

The present disclosure relates to the field of display technology, in particular to a gate driving unit, a gate driving method, a gate driving circuit and a display device.

BACKGROUND

In a conventional gate driving unit for a Low Temperature Polycrystalline Oxide (LTPO) pixel circuit, usually a gate driving signal for a P-type transistor is outputted by a P-type transistor, and a gate driving signal for an N-type transistor is obtained through a phase inverter, so the gate driving unit includes a large number of transistors.

SUMMARY

In one aspect, the present disclosure provides in some embodiments a gate driving unit, including a first clock signal end, a second clock signal end, a third clock signal end, a fourth clock signal end, a first output node control circuitry, a second output node control circuitry, a first control node control circuitry and an output circuitry. The first output node control circuitry is electrically coupled to a first output node, an input end, the first clock signal end, the fourth clock signal end, a first control node, the third clock signal end, a first voltage end and a second voltage end, and configured to control a potential at the first output node in accordance with an input signal from the input end and a first voltage signal from the first voltage end under the control of the input signal, a first clock signal from the first clock signal end and a fourth clock signal from the fourth clock signal end, write a second voltage signal from the second voltage end into the first output node under the control of a potential at the first control node and a third clock signal from the third clock signal end, and adjust the potential at the first output node in accordance with the third clock signal. The first control node control circuitry is electrically coupled to the first clock signal end, the first voltage end, the first control node and a first control end, and configured to write the first voltage signal into the first control node under the control of the first clock signal, and write the first clock signal into the first control node under the control of a potential at the first control end. The second output node control circuitry is electrically coupled to a second control end, the second clock signal end, a second output node, the first output node and the fourth clock signal end, and configured to write a second clock signal from the second clock signal end into a second control node under the control of a potential at the second control end, control the second control node to be electrically coupled to the second output node under the control of the second clock signal, write the fourth clock signal into the second output node under the control of the potential at the first output node, and adjust a potential at the second output end in accordance with the fourth clock signal. The output circuitry is electrically coupled to the first output node, the second output node, the fourth clock signal end, the first voltage end and a gate driving signal output end, and configured to write the first voltage signal into the gate driving signal output end under the control of the potential at the first output node, and write the fourth clock signal into the gate driving signal output end under the control of the potential at the second output node.

In some possible embodiments of the present disclosure, the first control end is the first output node; or the first control end is a first isolation node, the gate driving unit further includes a first isolation circuitry, the first isolation node is electrically coupled to the first output node through the first isolation circuitry, a control end of the first isolation circuitry is electrically coupled to a first control voltage end, and the first isolation circuitry is configured to control the first control end to be electrically coupled to the first output node under the control of a first control voltage from the first control voltage end.

In some possible embodiments of the present disclosure, the second control end is the first control node; or the second control end is a second isolation node, the gate driving unit further includes a second isolation circuitry, a control end of the second isolation circuitry is electrically coupled to a second control voltage end, and the second isolation circuitry is configured to control the second control end to be electrically coupled to the first control node under the control of a second control voltage from the first control voltage end.

In some possible embodiments of the present disclosure, the first output node control circuitry includes a first control end control sub-circuitry and a first output node control sub-circuitry. The first control end control sub-circuitry is electrically coupled to a first node, a second node, the input end, the first clock signal end, the fourth clock signal end, the first voltage end and the first control end, and configured to control the first voltage end to be electrically coupled to the first node under the control of the input signal, control a potential at the first node in accordance with the input signal, control the first node to be electrically coupled to the second node under the control of the fourth clock signal, and control the second node to be electrically coupled to the first control end under the control of the first clock signal. The first output node control sub-circuitry is electrically coupled to the second voltage end, the first control node, the third clock signal end and the first output node, and configured to write the second voltage signal from the second voltage end into the first output node under the control of the potential at the first control node and the third clock signal, and adjust the potential at the first output node in accordance with the third clock signal.

In some possible embodiments of the present disclosure, the first control end control sub-circuitry includes a first node control transistor, a second node control transistor, a third node control transmission and a first capacitor. A control electrode of the first node control transistor is electrically coupled to the input end, a first electrode of the first node control transistor is electrically coupled to the first voltage end, and a second electrode of the first node control transistor is electrically coupled to the first node. A control electrode of the second node control transistor is electrically coupled to the fourth clock signal end, a first electrode of the second node control transistor is electrically coupled to the first node, and a second electrode of the second node control transistor is electrically coupled to the second node. A first end of the first capacitor is electrically coupled to the input end, and a second end of the first capacitor is electrically coupled to the first node. A control electrode of the third node control transistor is electrically coupled to the first clock signal end, a first electrode of the third node control transistor is electrically coupled to the second node, and a second electrode of the third node control transistor is electrically coupled to the first control end.

In some possible embodiments of the present disclosure, the first output node control sub-circuitry includes a fourth node control transistor, a fifth node control transistor and a second capacitor. A control electrode of the fourth node control transistor is electrically coupled to the first control node, and a first electrode of the fourth node control transistor is electrically coupled to the second voltage end. A control electrode of the fifth node control transistor is electrically coupled to the third clock signal end, a first electrode of the fifth node control transistor is electrically coupled to a second electrode of the fourth node control transistor, and a second electrode of the fifth node control transistor is electrically coupled to the first output node. A first end of the second capacitor is electrically coupled to the first output node, and a second end of the second capacitor is electrically coupled to the third clock signal end.

In some possible embodiments of the present disclosure, when the gate driving unit further includes a first isolation circuitry, the first isolation circuitry includes a first isolation transistor, a control electrode of the first isolation transistor is electrically coupled to the first control voltage end, a first electrode of the first isolation transistor is electrically coupled to the first control end, and a second electrode of the first isolation transistor is electrically coupled to the first output node.

In some possible embodiments of the present disclosure, the first control node control circuitry includes a sixth node control transistor and a seventh node control transistor. A control electrode of the sixth node control transistor is electrically coupled to the first clock signal end, a first electrode of the sixth node control transistor is electrically coupled to the first voltage end, and a second electrode of the sixth node control transistor is electrically coupled to the first control node. A control electrode of the seventh node control transistor is electrically coupled to the first control end, a first electrode of the seventh node control transistor is electrically coupled to the first control node, and a second electrode of the seventh node control transistor is electrically coupled to the first clock signal end.

In some possible embodiments of the present disclosure, the second output node control circuitry includes an eighth node control transistor, a ninth node control transistor, a tenth node control transistor, a third capacitor and a fourth capacitor. A control electrode of the eighth node control transistor is electrically coupled to the second control end, and a first electrode of the eighth node control transistor is electrically coupled to the second clock signal end. A first end of the fourth capacitor is electrically coupled to the second control end, and a second end of the fourth capacitor is electrically coupled to a second electrode of the eighth node control transistor. A control electrode of the ninth node control transistor is electrically coupled to the second clock signal end, a first electrode of the ninth node control transistor is electrically coupled to the second electrode of the eighth node control transistor, and a second electrode of the ninth node control transistor is electrically coupled to the second output node. A control electrode of the tenth node control transistor is electrically coupled to the first output node, a first electrode of the tenth node control transistor is electrically coupled to the second output node, and a second electrode of the tenth node control transistor is electrically coupled to the fourth clock signal end. A first end of the third capacitor is electrically coupled to the second output node, and a second end of the third capacitor is electrically coupled to the fourth clock signal end.

In some possible embodiments of the present disclosure, when the gate driving unit further includes a second isolation circuitry, the second isolation circuitry includes a second isolation transistor, a control electrode of the second isolation transistor is electrically coupled to the second control voltage end, a first electrode of the second isolation transistor is electrically coupled to the first control node, and a second electrode of the second isolation transistor is electrically coupled to the second control end.

In some possible embodiments of the present disclosure, the output circuitry includes a first output transistor and a second output transistor. A control electrode of the first output transistor is electrically coupled to the first output node, a first electrode of the first output transistor is electrically coupled to the gate driving signal output end, and a second electrode of the first output transistor is electrically coupled to the first voltage end. A control electrode of the second output transistor is electrically coupled to the second output node, a first electrode of the second output transistor is electrically coupled to the fourth clock signal end, and a second electrode of the second output transistor is electrically coupled to the gate driving signal output end.

In another aspect, the present disclosure provides in some embodiments a gate driving method for the above-mentioned gate driving unit, including: controlling, by the first output node control circuitry, a potential at the first output node in accordance with an input signal and a first voltage signal under the control of the input signal, a first clock signal and a fourth clock signal, writing a second voltage signal into the first output node under the control of a potential at the first control node and a third clock signal, and adjusting the potential at the first output node in accordance with the third clock signal; writing, by the first control node control circuitry, the first voltage signal into the first control node under the control of the first clock signal, and writing the first clock signal into the first control node under the control of a potential at the first control end; writing, by the second output node control circuitry, a second clock signal into the second control node under the control of a potential at the second control end, controlling the second control node to be electrically coupled to the second output node under the control of the second clock signal, writing the fourth clock signal into the second output node under the control of the potential at the first output node, and adjusting a potential at the second output node in accordance with the fourth clock signal; and writing, by the output circuitry, the first voltage signal into the gate driving signal output end under the control of the potential at the first output node, and writing the fourth clock signal into the gate driving signal output end under the control of the potential at the second output node.

In yet another aspect, the present disclosure provides in some embodiments a gate driving circuitry including a plurality of levels of the above-mentioned gate driving units.

In still yet another aspect, the present disclosure provides in some embodiments a display device including the above-mentioned gate driving circuitry.

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Figure 1:
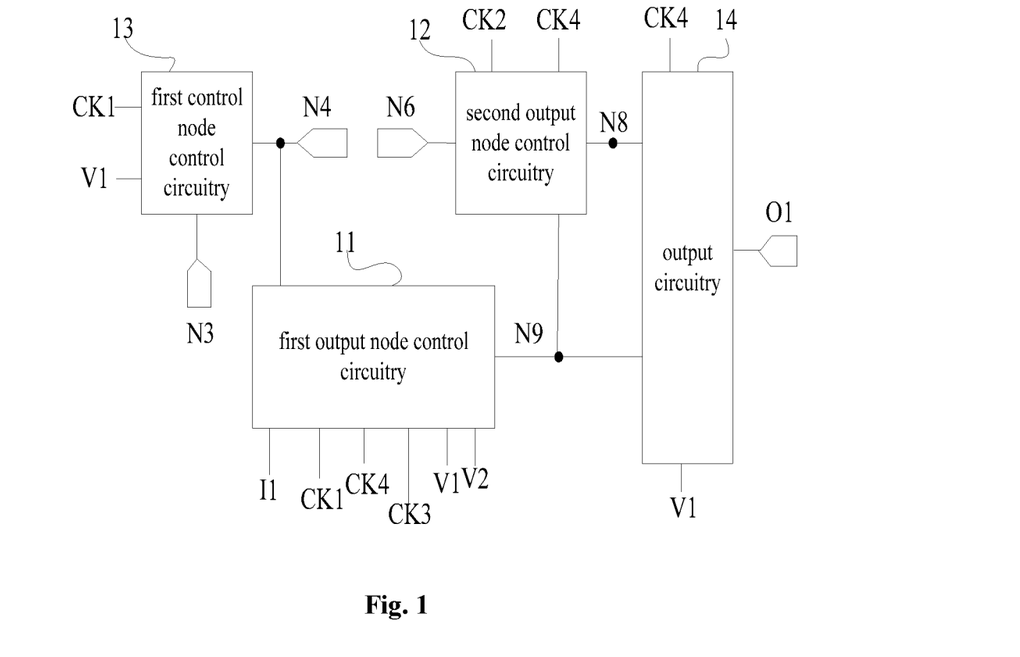
FIG. 1 is a schematic view showing a gate driving unit according to one embodiment of the present disclosure.

As shown in FIG. 1, the present disclosure provides in some embodiments a gate driving unit, which includes a first clock signal end, a second clock signal end, a third clock signal end, a fourth clock signal end, a first output node control circuitry 11, a second output node control circuitry 12, a first control node control circuitry 13 and an output circuitry 14.

The first output node control circuitry 11 is electrically coupled to a first output node N9, an input end I1, the first clock signal end, the fourth clock signal end, a first control node N4, the third clock signal end, a first voltage end V1 and a second voltage end V2, and configured to control a potential at the first output node N9 in accordance with an input signal from the input end I1 and a first voltage signal from the first voltage end V1 under the control of the input signal, a first clock signal CK1 from the first clock signal end and a fourth clock signal CK4 from the fourth clock signal end, write a second voltage signal from the second voltage end V2 into the first output node N9 under the control of a potential at the first control node N4 and a third clock signal CK3 from the third clock signal end, and adjust the potential at the first output node N9 in accordance with the third clock signal CK3.

The first control node control circuitry 13 is electrically coupled to the first clock signal end, the first voltage end V1, the first control node N4 and a first control end N3, and configured to write the first voltage signal into the first control node N4 under the control of the first clock signal CK1, and write the first clock signal CK1 into the first control node N4 under the control of a potential at the first control end N3.

The second output node control circuitry 12 is electrically coupled to a second control end N6, the second clock signal end, a second output node N8, the first output node N9 and the fourth clock signal end, and configured to write a second clock signal CK2 from the second clock signal end into a second control node N7 under the control of a potential at the second control end N6, control the second control node N7 to be electrically coupled to the second output node N8 under the control of the second clock signal CK2, write the fourth clock signal CK4 into the second output node N8 under the control of the potential at the first output node N9, and adjust a potential at the second output end N8 in accordance with the fourth clock signal CK4.

The output circuitry 14 is electrically coupled to the first output node N9, the second output node N8, the fourth clock signal end, the first voltage end V1 and a gate driving signal output end O1, and configured to write the first voltage signal into the gate driving signal output end O1 under the control of the potential at the first output node N9, and write the fourth clock signal CK4 into the gate driving signal output end O1 under the control of the potential at the second output node N8.

According to the gate driving unit in the embodiments of the present disclosure, it is able to provide a gate driving signal for N-type transistors in an LTPO pixel circuit, and reduce the number of transistors, thereby to provide a narrow bezel.

In at least one embodiment of the present disclosure, the first voltage is, but not limited to, a low voltage end, and the second voltage end is, but not limited to, a high voltage end.

During the operation of the gate driving unit in the embodiments of the present disclosure, the first output node control circuitry 11 controls the potential at the first output node N9 in accordance with the input signal and the first voltage signal under the control of the input signal, the first clock signal CK1 and the fourth clock signal CK4, writes the second voltage signal into the first output node N9 under the control of the potential at the first control node N4 and the third clock signal CK3, and adjusts the potential at the first output node N9 in accordance with the third clock signal CK3.

The first control node control circuitry 13 writes the first voltage signal into the first control node N4 under the control of the first clock signal CK1, and writes the first clock signal CK1 into the first control node N4 under the control of the potential at the first control end N3.

The second output node control circuitry 12 writes the second clock signal CK2 into the second control node N7 under the control of the potential at the second control end N6, controls the second control node N7 to be electrically coupled to the second output node N8 under the control of the second clock signal CK2, writes the fourth clock signal CK4 into the second output node N8 under the control of the potential at the first output node N9, and adjusts the potential at the second output node N8 in accordance with the fourth clock signal CK4.

The output circuitry 14 writes the first voltage signal into the gate driving signal output end O1 under the control of the potential at the first output node N9, and writes the fourth clock signal CK4 into the gate driving signal output end O1 under the control of the potential at the second output node N8.

In some possible embodiments of the present disclosure, the first control end is the first output node; or the first control end is a first isolation node, the gate driving unit further includes a first isolation circuitry, the first isolation node is electrically coupled to the first output node through the first isolation circuitry, a control end of the first isolation circuitry is electrically coupled to a first control voltage end, and the first isolation circuitry is configured to control the first control end to be electrically coupled to the first output node under the control of a first control voltage from the first control voltage end.

In some possible embodiments of the present disclosure, the second control end is the first control node; or the second control end is a second isolation node, the gate driving unit further includes a second isolation circuitry, a control end of the second isolation circuitry is electrically coupled to a second control voltage end, and the second isolation circuitry is configured to control the second control end to be electrically coupled to the first control node under the control of a second control voltage from the second control voltage end.

Figure 2:
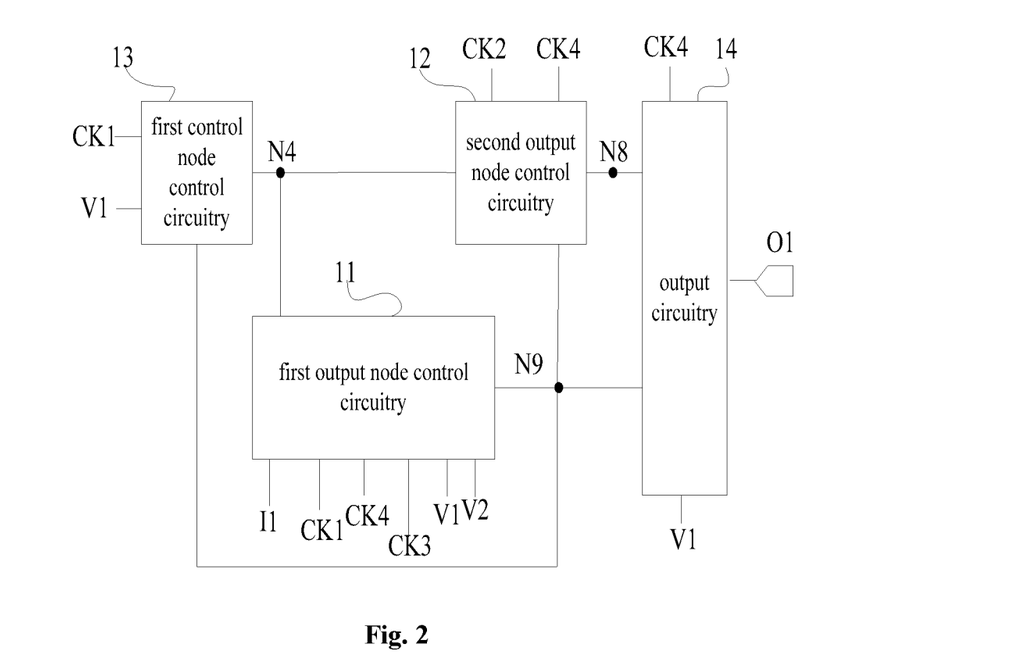
FIG. 2 is another schematic view showing the gate driving unit according to one embodiment of the present disclosure.

As shown in FIG. 2, on the basis of the gate driving unit in FIG. 1, the first control end is the first output node N9, and the second control end is the first control node N4.

Figure 3:
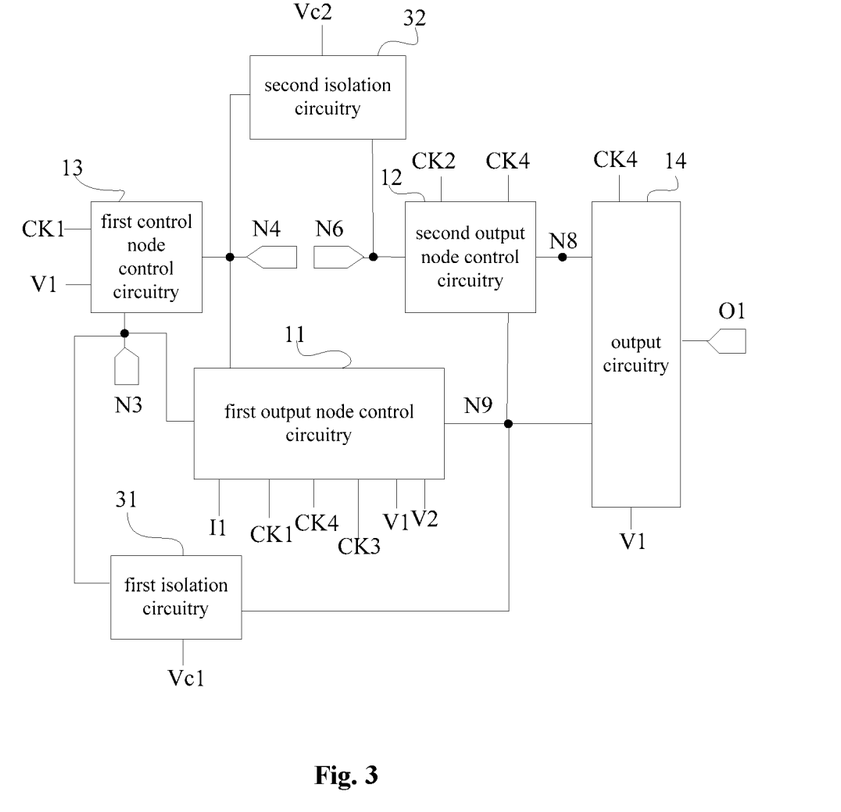
FIG. 3 is yet another schematic view showing the gate driving unit according to one embodiment of the present disclosure.

As shown in FIG. 3, on the basis of the gate driving unit in FIG. 1, the gate driving unit in the embodiments of the present disclosure further includes a first isolation circuitry 31 and a second isolation circuitry 32.

A control end of the first isolation circuitry 31 is electrically coupled to a first control voltage end Vc1, a first end of the first isolation circuitry 31 is electrically coupled to the first control end N3, and a second end of the first isolation circuitry 31 is electrically coupled to the first output node N9. The first isolation circuitry 31 is configured to control the first control end N3 to be electrically coupled to the first output node N9 under the control of a first control voltage from the first control voltage end Vc1.

A control end of the second isolation circuitry 32 is electrically coupled to a second control voltage end Vc2, a first end of the second isolation circuitry 32 is electrically coupled to the second control end N6, and a second end of the second isolation circuitry 32 is electrically coupled to the first control node N4. The second isolation circuitry 32 is configured to control the second control end N6 to be electrically coupled to the first control node N4 under the control of a second control voltage from the second control voltage end Vc2.

In addition, as shown in FIG. 3, when the gate driving unit in the embodiments of the present disclosure further includes the first isolation circuitry 31 and the second isolation circuitry 32, the first control end N3 is further electrically coupled to the first output node control circuitry 11.

During the implementation, the first isolation circuitry 31 includes a first isolation transistor, and the second isolation circuitry 32 includes a second isolation transistor. When the first isolation transistor and the second isolation transistor are both P-type transistors, each of the first control voltage end and the second control voltage end provides a low voltage. The first isolation transistor and the second isolation transistor are always-on transistors. The first isolation transistor is used to stabilize the potential at the first output node, and the second isolation transistor is used to stabilize the potential at the second control end N6.

Figure 4:
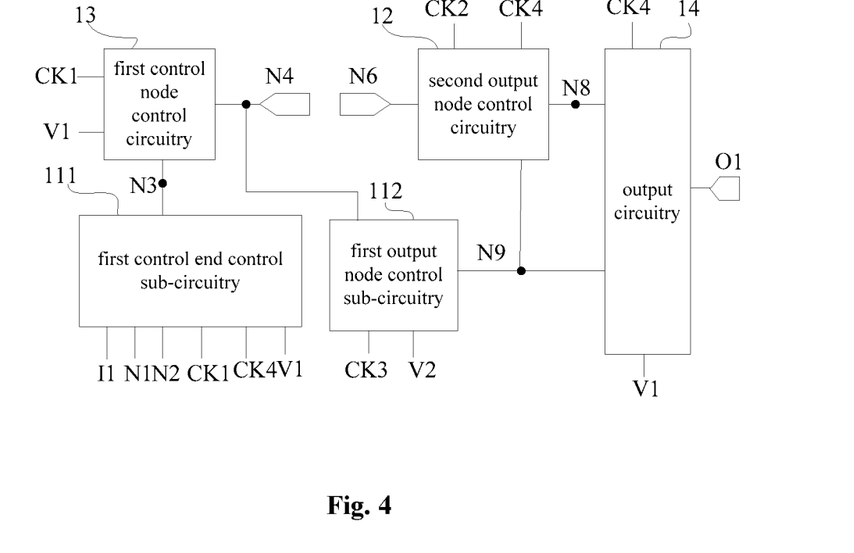
FIG. 4 is still yet another schematic view showing the gate driving unit according to one embodiment of the present disclosure.

In at least one embodiment of the present disclosure, as shown in FIG. 4, on the basis of the gate driving unit in FIG. 1, the first output node control circuitry includes a first control end control sub-circuitry 111 and a first output node control sub-circuitry 112.

The first control end control sub-circuitry 111 is electrically coupled to a first node N1, a second node N2, the input end I1, the first clock signal end, the fourth clock signal end, the first voltage end V1 and the first control end N3, and configured to control the first voltage end V1 to be electrically coupled to the first node N1 under the control of the input signal, control a potential at the first node N1 in accordance with the input signal, control the first node N1 to be electrically coupled to the second node N2 under the control of the fourth clock signal CLK4, and control the second node N2 to be electrically coupled to the first control end N3 under the control of the first clock signal CK1.

The first output node control sub-circuitry 112 is electrically coupled to the second voltage end V2, the first control node N4, the third clock signal end and the first output node N9, and configured to write the second voltage signal from the second voltage end V2 into the first output node N9 under the control of the potential at the first control node N4 and the third clock signal CK3, and adjust the potential at the first output node N9 in accordance with the third clock signal CK3.

During the implementation, the first output node control circuitry 11 includes the first control end control sub-circuitry 111 and the first output node control sub-circuitry 112. The first control end control sub-circuitry 111 controls the potential at the first control end N3, and the first output node control sub-circuitry 112 controls the potential at the first output node N9.

In some possible embodiments of the present disclosure, the first control end control sub-circuitry includes a first node control transistor, a second node control transistor, a third node control transmission and a first capacitor. A control electrode of the first node control transistor is electrically coupled to the input end, a first electrode of the first node control transistor is electrically coupled to the first voltage end, and a second electrode of the first node control transistor is electrically coupled to the first node. A control electrode of the second node control transistor is electrically coupled to the fourth clock signal end, a first electrode of the second node control transistor is electrically coupled to the first node, and a second electrode of the second node control transistor is electrically coupled to the second node. A first end of the first capacitor is electrically coupled to the input end, and a second end of the first capacitor is electrically coupled to the first node. A control electrode of the third node control transistor is electrically coupled to the first clock signal end, a first electrode of the third node control transistor is electrically coupled to the second node, and a second electrode of the third node control transistor is electrically coupled to the first control end.

In some possible embodiments of the present disclosure, the first output node control sub-circuitry includes a fourth node control transistor, a fifth node control transistor and a second capacitor. A control electrode of the fourth node control transistor is electrically coupled to the first control node, and a first electrode of the fourth node control transistor is electrically coupled to the second voltage end. A control electrode of the fifth node control transistor is electrically coupled to the third clock signal end, a first electrode of the fifth node control transistor is electrically coupled to a second electrode of the fourth node control transistor, and a second electrode of the fifth node control transistor is electrically coupled to the first output node. A first end of the second capacitor is electrically coupled to the first output node, and a second end of the second capacitor is electrically coupled to the third clock signal end.

In at least one embodiment of the present disclosure, when the gate driving unit further includes a first isolation circuitry, the first isolation circuitry includes a first isolation transistor, a control electrode of the first isolation transistor is electrically coupled to the first control voltage end, a first electrode of the first isolation transistor is electrically coupled to the first control end, and a second electrode of the first isolation transistor is electrically coupled to the first output node.

In some possible embodiments of the present disclosure, the first control node control circuitry includes a sixth node control transistor and a seventh node control transistor. A control electrode of the sixth node control transistor is electrically coupled to the first clock signal end, a first electrode of the sixth node control transistor is electrically coupled to the first voltage end, and a second electrode of the sixth node control transistor is electrically coupled to the first control node. A control electrode of the seventh node control transistor is electrically coupled to the first control end, a first electrode of the seventh node control transistor is electrically coupled to the first control node, and a second electrode of the seventh node control transistor is electrically coupled to the first clock signal end.

In some possible embodiments of the present disclosure, the second output node control circuitry includes an eighth node control transistor, a ninth node control transistor, a tenth node control transistor, a third capacitor and a fourth capacitor. A control electrode of the eighth node control transistor is electrically coupled to the second control end, and a first electrode of the eighth node control transistor is electrically coupled to the second clock signal end. A first end of the fourth capacitor is electrically coupled to the second control end, and a second end of the fourth capacitor is electrically coupled to a second electrode of the eighth node control transistor. A control electrode of the ninth node control transistor is electrically coupled to the second clock signal end, a first electrode of the ninth node control transistor is electrically coupled to the second electrode of the eighth node control transistor, and a second electrode of the ninth node control transistor is electrically coupled to the second output node. A control electrode of the tenth node control transistor is electrically coupled to the first output node, a first electrode of the tenth node control transistor is electrically coupled to the second output node, and a second electrode of the tenth node control transistor is electrically coupled to the fourth clock signal end. A first end of the third capacitor is electrically coupled to the second output node, and a second end of the third capacitor is electrically coupled to the fourth clock signal end.

During the implementation, when the gate driving unit further includes a second isolation circuitry, the second isolation circuitry includes a second isolation transistor, a control electrode of the second isolation transistor is electrically coupled to the second control voltage end, a first electrode of the second isolation transistor is electrically coupled to the first control node, and a second electrode of the second isolation transistor is electrically coupled to the second control end.

Figure 5:
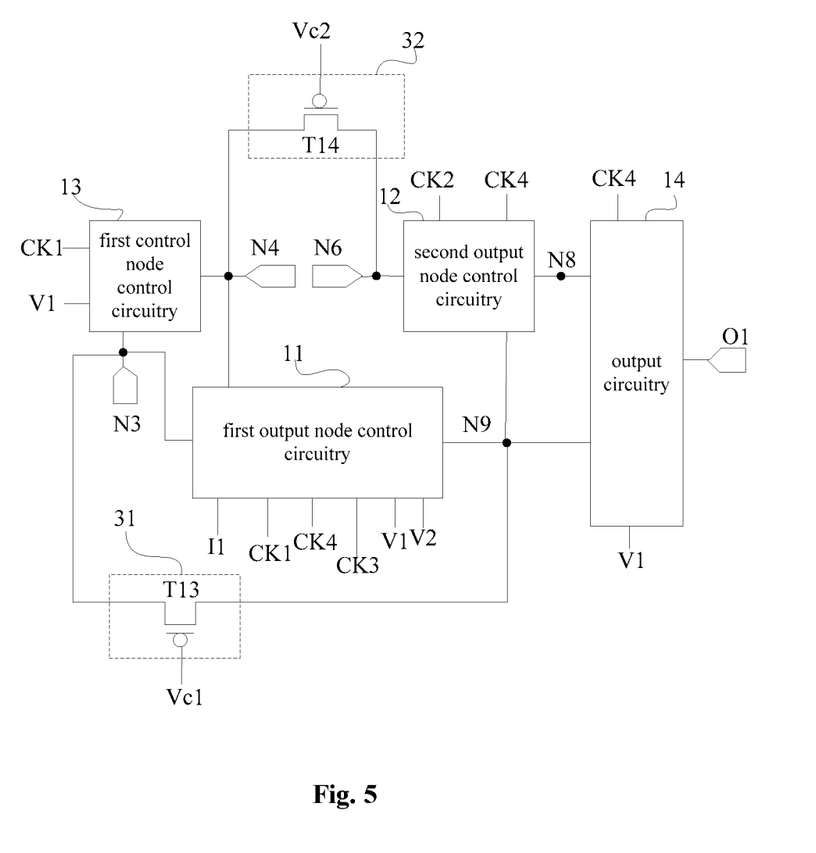
FIG. 5 is still yet another schematic view showing the gate driving unit according to one embodiment of the present disclosure.

As shown in FIG. 5, on the basis of the gate driving unit in FIG. 3, the first isolation circuitry 31 includes a first isolation transistor T13, and the second isolation circuitry 32 includes a second isolation transistor T14.

A gate electrode of the first isolation transistor T13 is electrically coupled to the first control voltage end Vc1, a drain electrode of the first isolation transistor T13 is electrically coupled to the first control end N3, and a source electrode of the first isolation transistor T13 is electrically coupled to the first output node N9.

A gate electrode of the second isolation transistor T14 is electrically coupled to the second control voltage end Vc2, a drain electrode of the second isolation transistor T14 is electrically coupled to the first control node N4, and a source electrode of the second isolation transistor T14 is electrically coupled to the second control end N6.

In FIGS. 5, T13 and T14 are both P-type thin film transistors, Vc1 and Vc2 are both low voltage ends, and T13 and T14 are both always-on transistors. However, the present disclosure is not limited thereto.

In some possible embodiments of the present disclosure, the output circuitry includes a first output transistor and a second output transistor. A control electrode of the first output transistor is electrically coupled to the first output node, a first electrode of the first output transistor is electrically coupled to the gate driving signal output end, and a second electrode of the first output transistor is electrically coupled to the first voltage end. A control electrode of the second output transistor is electrically coupled to the second output node, a first electrode of the second output transistor is electrically coupled to the fourth clock signal end, and a second electrode of the second output transistor is electrically coupled to the gate driving signal output end.

Figure 6A:
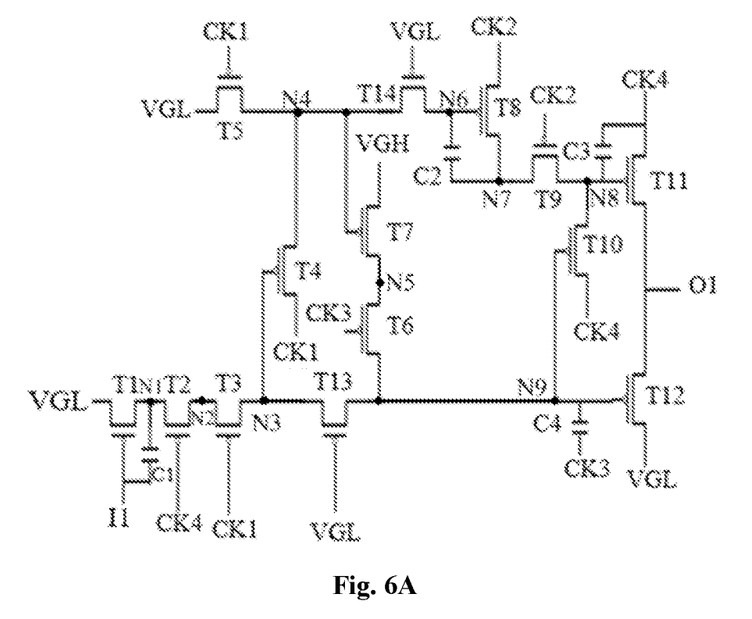
FIGS. 6A and 6B are circuit diagrams of the gate driving unit according to one embodiment of the present disclosure.

As shown in FIG. 6A, on the basis of the gate driving unit in FIG. 5, the first output node control circuitry includes a first control end control sub-circuitry and a first output node control sub-circuitry.

The first control end control sub-circuitry includes a first node control transistor T1, a second node control transistor T2, a third node control transistor T3 and a first capacitor C1.

A gate electrode of the first node control transistor T1 is electrically coupled to the input end I1, a drain electrode of the first node control transistor T1 is electrically coupled to a low voltage end, and a source electrode of the first node control transistor T1 is electrically coupled to the first node N1. The low voltage end is used to provide a low voltage VGL.

A gate electrode of the second node control transistor T2 is electrically coupled to the fourth clock signal end, a drain electrode of the second node control transistor T2 is electrically coupled to the first node N1, and a source electrode of the second node control transistor T2 is electrically coupled to the second node N2. The fourth clock signal end is used to provide the fourth clock signal CK4.

A first end of the first capacitor C1 is electrically coupled to the input end I1, and a second end of the first capacitor C1 is electrically coupled to the first node N1.

A gate electrode of the third node control transistor T3 is electrically coupled to the first clock signal end, a drain electrode of the third node control transistor T3 is electrically coupled to the second node N2, and a source electrode of the third node control transistor T3 is electrically coupled to the first control end N3.

The first output node control sub-circuitry includes a fourth node control transistor T7, a fifth node control transistor T6, and a second capacitor C4.

A gate electrode of the fourth node control transistor T7 is electrically coupled to the first control node N4, and a drain electrode of the fourth node control transistor T7 is electrically coupled to a high voltage end. The high voltage end is used to provide a high voltage VGH.

A gate electrode of the fifth node control transistor T6 is electrically coupled to the third clock signal end, a drain electrode of the fifth node control transistor T6 is electrically coupled to a source electrode of the fourth node control transistor T7, and a source electrode of the fifth node control transistor T6 is electrically coupled to the first output node N9. The third clock signal end is used to provide the third clock signal CK3.

A first end of the second capacitor C4 is electrically coupled to the first output node N9, and a second end of the second capacitor C4 is electrically coupled to the third clock signal end.

The first control node control circuitry includes a sixth node control transistor T5 and a seventh node control transistor T4.

A gate electrode of the sixth node control transistor T5 is electrically coupled to the first clock signal end, a drain electrode of the sixth node control transistor T5 is electrically coupled to the low voltage end, and a source electrode of the sixth node control transistor T5 is electrically coupled to the first control node N4. The first clock signal end is used to provide the first clock signal CK1.

A gate electrode of the seventh node control transistor T4 is electrically coupled to the first control end N3, a drain electrode of the seventh node control transistor T4 is electrically coupled to the first control node N4, and a source electrode of the seventh node control transistor T4 is electrically coupled to the first clock signal end.

The second output node control circuitry includes an eighth node control transistor T8, a ninth node control transistor T9, a tenth node control transistor T10, a third capacitor C3 and a fourth capacitor C2.

A gate electrode of the eighth node control transistor T8 is electrically coupled to the second control end N6, and a drain electrode of the eighth node control transistor T8 is electrically coupled to the second clock signal end. The second clock signal end is used to provide the second clock signal CK2.

A first end of the fourth capacitor C2 is electrically coupled to the second control end N6, and a second end of the fourth capacitor C2 is electrically coupled to a source electrode of the eighth node control transistor T8.

A gate electrode of the ninth node control transistor T9 is electrically coupled to the second clock signal end, a drain electrode of the ninth node control transistor T9 is electrically coupled to the source electrode of the eighth node control transistor T8, and a source electrode of the ninth node control transistor T9 is electrically coupled to the second output node N8.

A gate electrode of the tenth node control transistor T10 is electrically coupled to the first output node N9, a drain electrode of the tenth node control transistor T10 is electrically coupled to the second output node N8, and a source electrode of the tenth node control transistor T10 is electrically coupled to the fourth clock signal end. The fourth clock signal end is used to provide the fourth clock signal CK4.

A first end of the third capacitor C3 is electrically coupled to the second output node N8, and a second end of the third capacitor C3 is electrically coupled to the fourth clock signal end.

The output circuitry includes a first output transistor T12 and a second output transistor T11.

A gate electrode of the first output transistor T12 is electrically coupled to the first output node N9, a drain electrode of the first output transistor T12 is electrically coupled to the gate driving signal output end O1, and a source electrode of the first output transistor T12 is electrically coupled to the low voltage end.

A gate electrode of the second output transistor T11 is electrically coupled to the second output node N8, a drain electrode of the second output transistor T11 is electrically coupled to the fourth clock signal end, and a source electrode of the second output transistor T11 is electrically coupled to the gate driving signal output end O1.

In the gate driving unit in FIG. 6A, all the transistors are, but not limited to, P-type thin film transistors.

Figure 6B:
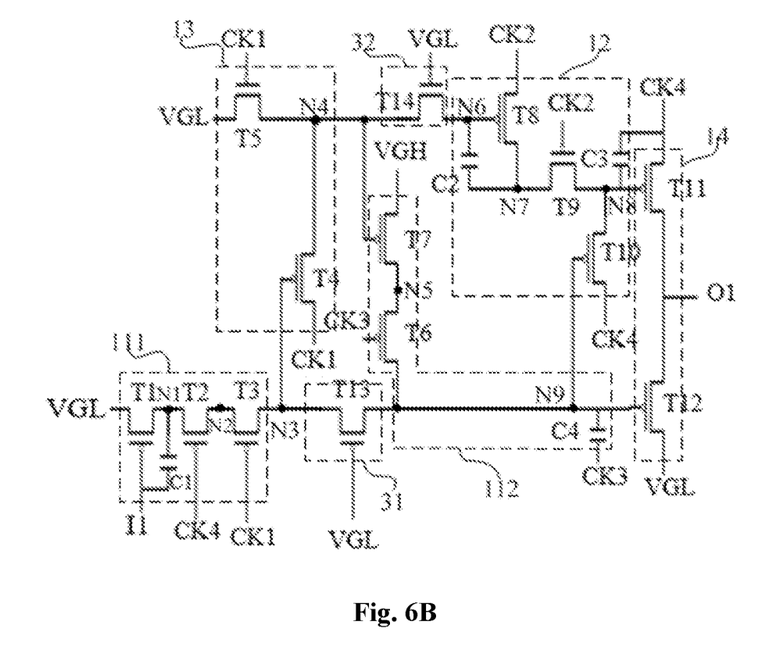

FIG. 6B shows reference numerals 31, 32, 111, 112, 12, 13 and 14 on the basis of FIG. 6A.

In the gate driving unit in FIG. 6A, N7 is a node electrically coupled to the source electrode of T8, and N5 is a node electrically coupled to the drain electrode of T6.

Figure 7:
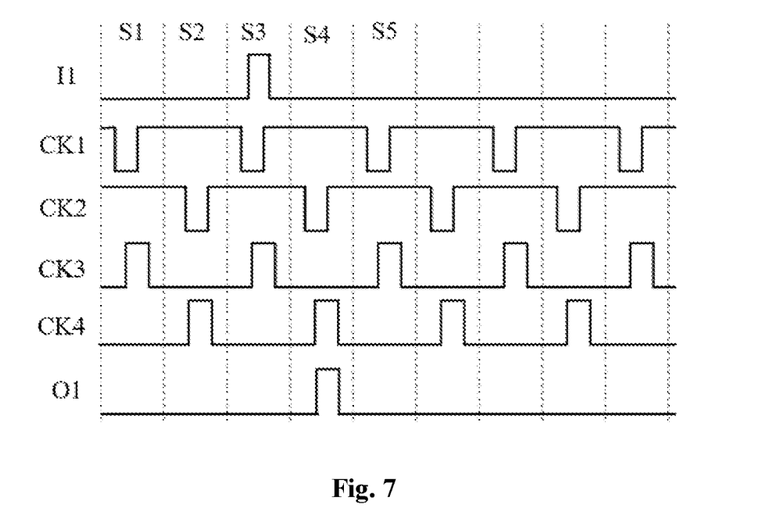
FIG. 7 is a sequence diagram of the gate driving unit in FIG. 6A.

As shown in FIG. 7, during the operation of the gate driving unit in FIG. 6A, at a first stage S1, I1 provides a low voltage, CK2 is a high voltage, CK4 is a low voltage, and a falling edge of CK1 precedes a rising edge of CK3. T1 and T2 are continuously in an on state, and T5 is turned on when CK1 is a low voltage, so that the potential at N4 is VGL-Vth (5), where Vth (5) is a threshold voltage of T5. When CK3 is changed to a high voltage, T6 is turned off. At this time, CK1 is a low voltage, so the potential at N3 is pulled down, so as to turn on T4. The potential at N4 is a low voltage, so T14 is turned on. The potential at N6 is a low voltage, and when CK1 is changed to a high voltage, the potential at N4 and the potential at N6 are pulled up. When CK1 is a low voltage and CK3 is a high voltage, the potential at N3 and the potential at N9 are changed to a low potential, so as to turn on T4. T9 is continuously in an off state, and a falling edge of CK3 pulls down the potential at N9 due to a bootstrapping effect, so as to turn on T10. The potential at N8 is a low voltage, and T11 and T12 are turned on, so O1 outputs a low voltage.

At a second stage S2, I1 provides a low voltage, CK1 is a high voltage, and CK3 is a low voltage, so the potential at N1, the potential at N2 and the potential at N3 are maintained as a low voltage. CK1 is a high voltage, the potential at N4 and the potential at N6 are a high voltage, and the potential at N9 is maintained as a low voltage, so T12 is turned on. When CK4 is changed from a low voltage to a high voltage, the potential at N8 is pulled up due to a bootstrapping effect of C3, and T11 is turned off, so O1 outputs a low voltage.

At a third stage S3, I1 provides a high voltage, CK2 is a high voltage, CK4 is a low voltage, and the potential at N1 is pulled up due to a bootstrapping effect of C1, so T1 is turned off and T2 is turned on. When CK1 is a low voltage, T3 is turned on, T13 is turned on, and the potential at N1, the potential at N2, the potential at N3 and the potential at N9 are pulled up to different extents when CK1 is set to be the low voltage. T10 and T12 are turn off, T9 is continuously in an off state, the potential at N8 is maintained as a low voltage, and T11 is turned on, so O1 outputs a low voltage.

At a third stage S3, when CK1 is a low voltage, T5 is turned on, and the potential at N4 is a low voltage.

At a fourth stage S4, I1 provides a low voltage, CK1 is a high voltage, and CK3 is a low voltage, so T3 is turned off, and T6 is turned off. The potential at N9 is maintained as a high voltage, so T10, T12, T5, T4 and T1 are turned off. The potential at N4 is maintained as a low voltage, and the potential at N6 is a low voltage. When CK2 is changed to a low voltage, T8 is turned on. The potential at N7 and the potential at N8 are a low voltage, and T11 is turned on, so O1 outputs CK4. When CK2 jumps from a high voltage to a low voltage, the potential at N6 is pulled down to a smaller value due to a bootstrapping effect of C2, so T8 is turned on more thoroughly.

At a fifth stage S5, I1 provides a low voltage, CK2 is a high voltage, and CK4 is a low voltage, so T1 and T2 are turned on, and the potentials at N1 and N2 are a low voltage. When CK1 is changed to a low voltage, T3 is turned on, potential at N1, the potential at N2 and the potential at N3 are pulled down, and T4 is turned on. When CK1 is a low voltage, T5 is turned on, the potential at N4 is a low voltage, T14 is turned on (in an always-on state), the potential at N6 is a low voltage, T8 is turned on, and the potential at N7 is a high voltage (the potential at N7 is changed to a high voltage when CK2 is a high voltage). When CK1 is changed from a low voltage to a high voltage, T5 is turned off, the potential at N4 is changed to a high voltage (at this time, T4 is turned on, and the potential at N4 is a high voltage when CK1 is a high voltage), T14 is turned on (in an always-on state), the potential at N6 is a high voltage, T8 is turned off, and the potential at N7 is maintained as a high voltage. T9 is turned off, the potential at N8 is a low voltage at the fourth stage S4, and the potential at N7 is pulled down to a lower voltage due to a bootstrapping effect of C3 at the fifth stage S5. T11 is turned on thoroughly, the potential at N9 is pulled down continuously after T7 is turned off and is further pulled down by C4 when CK3 jumps to a low voltage, and T12 is turned on thoroughly, so O1 outputs a low voltage.

In FIGS. 6A and 6B, the potential at N9 is pulled down by C3 periodically under the control of the third clock signal CK3, so as to thoroughly turn on T12, thereby to prevent an output waveform from being adversely affected by the threshold voltage of T12.

In FIGS. 6A and 6B, the first isolation transistor T13 is used to stabilize the potential at the first output node N9, and the second isolation transistor T14 is used to stabilize the potential at the second control end N6. Each of N9 and N6 is electrically coupled to a capacitor, so it is able to improve the stability of the whole circuit when the potentials at N9 and N6 are stabilized.

As shown in FIG. 7, a falling edge of CK1 precedes a rising edge of CK3, a rising edge of CK1 precedes a falling edge of CK3, a falling edge of CK2 precedes a rising edge of CK4, and a rising edge of CK2 precedes a falling edge of CK4. However, the present disclosure is not limited thereto.

According to the gate driving unit in FIG. 6A, it is able to provide the gate driving signal for the operation of the N-type transistor through O1, and reduce the number of transistors, thereby to provide a narrow bezel.

Figure 8:
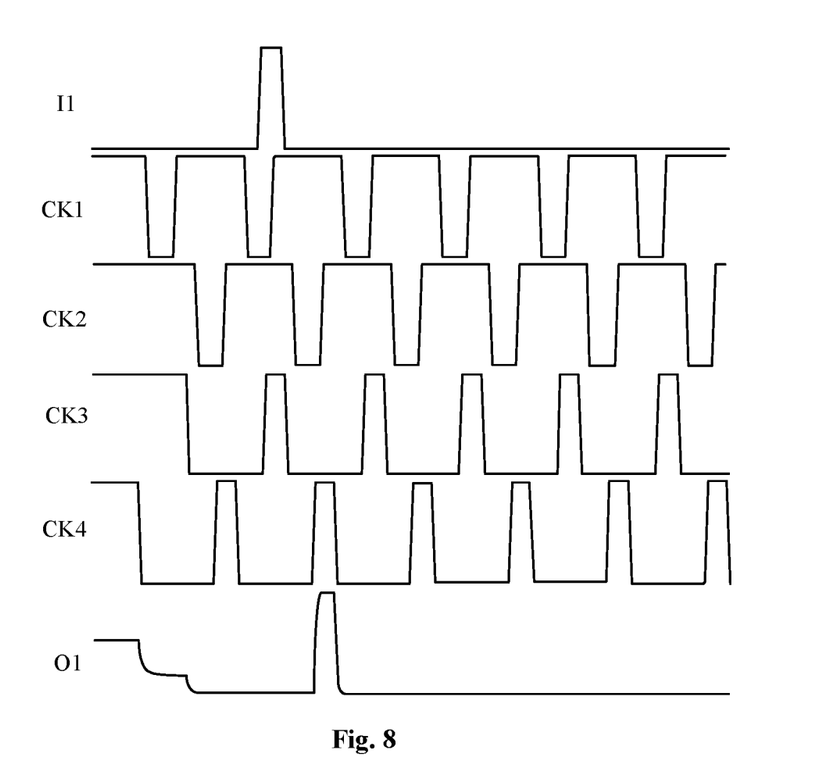
FIG. 8 is a simulation sequence diagram of the gate driving unit in FIG. 6A corresponding to FIG. 7.

FIG. 8 is a simulation sequence diagram of the gate driving unit in FIG. 6A corresponding to FIG. 7.

Figure 9:
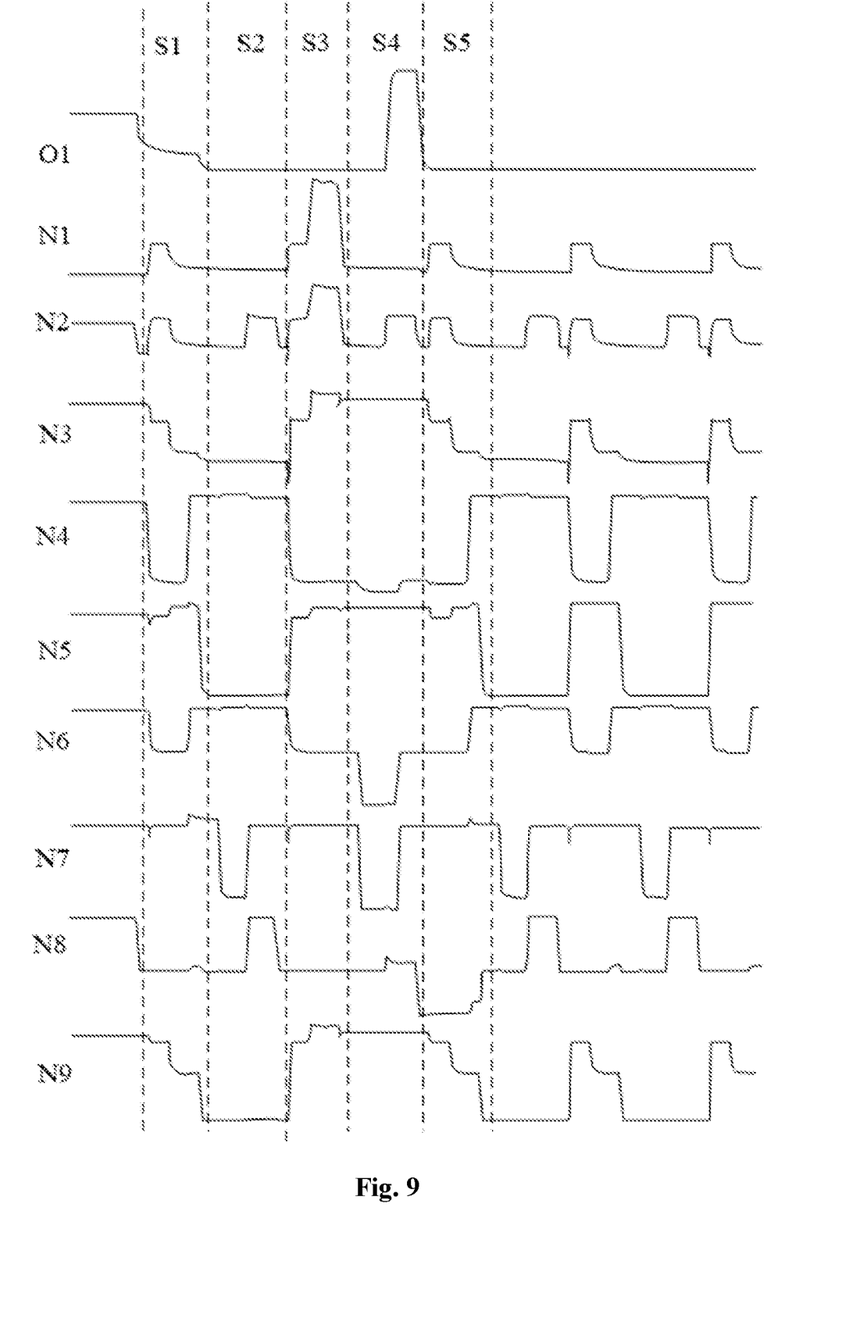
FIG. 9 is an oscillogram of signals at nodes of the gate driving unit in FIG. 6A during the operation.

FIG. 9 is an oscillogram of the signals at the nodes of the gate driving unit in FIG. 6A during the operation.

The present disclosure further provides in some embodiments a gate driving method for the above-mentioned gate driving unit, which includes: controlling, by the first output node control circuitry, a potential at the first output node in accordance with an input signal and a first voltage signal under the control of the input signal, a first clock signal and a fourth clock signal, writing a second voltage signal into the first output node under the control of a potential at the first control node and a third clock signal, and adjusting the potential at the first output node in accordance with the third clock signal; writing, by the first control node control circuitry, the first voltage signal into the first control node under the control of the first clock signal, and writing the first clock signal into the first control node under the control of a potential at the first control end; writing, by the second output node control circuitry, a second clock signal into the second control node under the control of a potential at the second control end, controlling the second control node to be electrically coupled to the second output node under the control of the second clock signal, writing the fourth clock signal into the second output node under the control of the potential at the first output node, and adjusting a potential at the second output node in accordance with the fourth clock signal; and writing, by the output circuitry, the first voltage signal into the gate driving signal output end under the control of the potential at the first output node, and writing the fourth clock signal into the gate driving signal output end under the control of the potential at the second output node.

The present disclosure further provides in some embodiments a gate driving circuit including a plurality of levels of the above-mentioned gate driving units.

During the implementation, in the gate driving circuit, apart from a first-level gate driving unit, an input end of a current-level gate driving unit is electrically coupled to a gate driving signal output end of a previous-level gate driving unit.

The present disclosure further provides in some embodiments a display device including the above-mentioned gate driving circuit.

The display device in the embodiments of the present disclosure may be any product or member having a display function, e.g., mobile phone, tablet computer, television, display, laptop computer, digital photo frame or navigator.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A gate driving unit, comprising a first clock signal end, a second clock signal end, a third clock signal end, a fourth clock signal end, a first output node control circuitry, a second output node control circuitry, a first control node control circuitry and an output circuitry, wherein the first output node control circuitry is electrically coupled to a first output node, an input end, the first clock signal end, the fourth clock signal end, a first control node, the third clock signal end, a first voltage end and a second voltage end, and configured to control a potential at the first output node in accordance with an input signal from the input end and a first voltage signal from the first voltage end under the control of the input signal from the input end, a first clock signal from the first clock signal end and a fourth clock signal from the fourth clock signal end, write a second voltage signal from the second voltage end into the first output node under the control of a potential at the first control node and a third clock signal from the third clock signal end, and adjust the potential at the first output node in accordance with the third clock signal;

the first control node control circuitry is electrically coupled to the first clock signal end, the first voltage end, the first control node and a first control end, and configured to write the first voltage signal into the first control node under the control of the first clock signal, and write the first clock signal into the first control node under the control of a potential at the first control end;

the second output node control circuitry is electrically coupled to a second control end, the second clock signal end, a second output node, the first output node and the fourth clock signal end, and configured to write a second clock signal from the second clock signal end into a second control node under the control of a potential at the second control end, control the second control node to be electrically coupled to the second output node under the control of the second clock signal, write the fourth clock signal into the second output node under the control of the potential at the first output node, and adjust a potential at the second output end in accordance with the fourth clock signal;

the output circuitry is electrically coupled to the first output node, the second output node, the fourth clock signal end, the first voltage end and a gate driving signal output end, and configured to write the first voltage signal into the gate driving signal output end under the control of the potential at the first output node, and write the fourth clock signal into the gate driving signal output end under the control of the potential at the second output node; and the first output node control circuitry is electrically coupled to the first control end.

2. The gate driving unit according to claim 1, wherein the first control end is the first output node; or the first control end is a first isolation node, the gate driving unit further comprises a first isolation circuitry, the first isolation node is electrically coupled to the first output node through the first isolation circuitry, a control end of the first isolation circuitry is electrically coupled to a first control voltage end, and the first isolation circuitry is configured to control the first control end to be electrically coupled to the first output node under the control of a first control voltage from the first control voltage end.

3. The gate driving unit according to claim 1, wherein the second control end is the first control node; or the second control end is a second isolation node, the gate driving unit further comprises a second isolation circuitry, a control end of the second isolation circuitry is electrically coupled to a second control voltage end, and the second isolation circuitry is configured to control the second control end to be electrically coupled to the first control node under the control of a second control voltage from the second control voltage end.

4. The gate driving unit according to claim 3, wherein the second output node control circuitry comprises an eighth node control transistor, a ninth node control transistor, a tenth node control transistor, a third capacitor and a fourth capacitor;

a control electrode of the eighth node control transistor is electrically coupled to the second control end, and a first electrode of the eighth node control transistor is electrically coupled to the second clock signal end;

a first end of the fourth capacitor is electrically coupled to the second control end, and a second end of the fourth capacitor is electrically coupled to a second electrode of the eighth node control transistor;

a control electrode of the ninth node control transistor is electrically coupled to the second clock signal end, a first electrode of the ninth node control transistor is electrically coupled to the second electrode of the eighth node control transistor, and a second electrode of the ninth node control transistor is electrically coupled to the second output node;

a control electrode of the tenth node control transistor is electrically coupled to the first output node, a first electrode of the tenth node control transistor is electrically coupled to the second output node, and a second electrode of the tenth node control transistor is electrically coupled to the fourth clock signal end; and a first end of the third capacitor is electrically coupled to the second output node, and a second end of the third capacitor is electrically coupled to the fourth clock signal end.

5. The gate driving unit according to claim 3, wherein when the gate driving unit further comprises a second isolation circuitry, the second isolation circuitry comprises a second isolation transistor, a control electrode of the second isolation transistor is electrically coupled to the second control voltage end, a first electrode of the second isolation transistor is electrically coupled to the first control node, and a second electrode of the second isolation transistor is electrically coupled to the second control end.

6. The gate driving unit according to claim 2, wherein the first output node control circuitry comprises a first control end control sub-circuitry and a first output node control sub-circuitry;

the first control end control sub-circuitry is electrically coupled to a first node, a second node, the input end, the first clock signal end, the fourth clock signal end, the first voltage end and the first control end, and configured to control the first voltage end to be electrically coupled to the first node under the control of the input signal, control a potential at the first node in accordance with the input signal, control the first node to be electrically coupled to the second node under the control of the fourth clock signal, and control the second node to be electrically coupled to the first control end under the control of the first clock signal; and the first output node control sub-circuitry is electrically coupled to the second voltage end, the first control node, the third clock signal end and the first output node, and configured to write the second voltage signal from the second voltage end into the first output node under the control of the potential at the first control node and the third clock signal, and adjust the potential at the first output node in accordance with the third clock signal.

7. The gate driving unit according to claim 6, wherein the first control end control sub-circuitry comprises a first node control transistor, a second node control transistor, a third node control transmission and a first capacitor;

a control electrode of the first node control transistor is electrically coupled to the input end, a first electrode of the first node control transistor is electrically coupled to the first voltage end, and a second electrode of the first node control transistor is electrically coupled to the first node;

a control electrode of the second node control transistor is electrically coupled to the fourth clock signal end, a first electrode of the second node control transistor is electrically coupled to the first node, and a second electrode of the second node control transistor is electrically coupled to the second node;

a first end of the first capacitor is electrically coupled to the input end, and a second end of the first capacitor is electrically coupled to the first node; and a control electrode of the third node control transistor is electrically coupled to the first clock signal end, a first electrode of the third node control transistor is electrically coupled to the second node, and a second electrode of the third node control transistor is electrically coupled to the first control end.

8. The gate driving unit according to claim 6, wherein the first output node control sub-circuitry comprises a fourth node control transistor, a fifth node control transistor and a second capacitor;

a control electrode of the fourth node control transistor is electrically coupled to the first control node, and a first electrode of the fourth node control transistor is electrically coupled to the second voltage end;

a control electrode of the fifth node control transistor is electrically coupled to the third clock signal end, a first electrode of the fifth node control transistor is electrically coupled to a second electrode of the fourth node control transistor, and a second electrode of the fifth node control transistor is electrically coupled to the first output node; and a first end of the second capacitor is electrically coupled to the first output node, and a second end of the second capacitor is electrically coupled to the third clock signal end.

9. The gate driving unit according to claim 2, wherein when the gate driving unit further comprises a first isolation circuitry, the first isolation circuitry comprises a first isolation transistor, a control electrode of the first isolation transistor is electrically coupled to the first control voltage end, a first electrode of the first isolation transistor is electrically coupled to the first control end, and a second electrode of the first isolation transistor is electrically coupled to the first output node.

10. The gate driving unit according to claim 1, wherein the first control node control circuitry comprises a sixth node control transistor and a seventh node control transistor;

a control electrode of the sixth node control transistor is electrically coupled to the first clock signal end, a first electrode of the sixth node control transistor is electrically coupled to the first voltage end, and a second electrode of the sixth node control transistor is electrically coupled to the first control node; and a control electrode of the seventh node control transistor is electrically coupled to the first control end, a first electrode of the seventh node control transistor is electrically coupled to the first control node, and a second electrode of the seventh node control transistor is electrically coupled to the first clock signal end.

11. The gate driving unit according to claim 1, wherein the output circuitry comprises a first output transistor and a second output transistor;

a control electrode of the first output transistor is electrically coupled to the first output node, a first electrode of the first output transistor is electrically coupled to the gate driving signal output end, and a second electrode of the first output transistor is electrically coupled to the first voltage end; and a control electrode of the second output transistor is electrically coupled to the second output node, a first electrode of the second output transistor is electrically coupled to the fourth clock signal end, and a second electrode of the second output transistor is electrically coupled to the gate driving signal output end.

12. A gate driving method for the gate driving unit according to claim 1, the gate driving method comprising:

controlling, by the first output node control circuitry, a potential at the first output node in accordance with an input signal and a first voltage signal under the control of the input signal, a first clock signal and a fourth clock signal, writing a second voltage signal into the first output node under the control of a potential at the first control node and a third clock signal, and adjusting the potential at the first output node in accordance with the third clock signal;

writing, by the first control node control circuitry, the first voltage signal into the first control node under the control of the first clock signal, and writing the first clock signal into the first control node under the control of a potential at the first control end;

writing, by the second output node control circuitry, a second clock signal into the second control node under the control of a potential at the second control end, controlling the second control node to be electrically coupled to the second output node under the control of the second clock signal, writing the fourth clock signal into the second output node under the control of the potential at the first output node, and adjusting a potential at the second output node in accordance with the fourth clock signal; and writing, by the output circuitry, the first voltage signal into the gate driving signal output end under the control of the potential at the first output node, and writing the fourth clock signal into the gate driving signal output end under the control of the potential at the second output node.

13. A gate driving circuit comprising a plurality of levels of gate driving units, and each gate driving unit comprising a first clock signal end, a second clock signal end, a third clock signal end, a fourth clock signal end, a first output node control circuitry, a second output node control circuitry, a first control node control circuitry and an output circuitry, wherein the first output node control circuitry is electrically coupled to a first output node, an input end, the first clock signal end, the fourth clock signal end, a first control node, the third clock signal end, a first voltage end and a second voltage end, and configured to control a potential at the first output node in accordance with an input signal from the input end and a first voltage signal from the first voltage end under the control of the input signal from the input end, a first clock signal from the first clock signal end and a fourth clock signal from the fourth clock signal end, write a second voltage signal from the second voltage end into the first output node under the control of a potential at the first control node and a third clock signal from the third clock signal end, and adjust the potential at the first output node in accordance with the third clock signal;

the first control node control circuitry is electrically coupled to the first clock signal end, the first voltage end, the first control node and a first control end, and configured to write the first voltage signal into the first control node under the control of the first clock signal, and write the first clock signal into the first control node under the control of a potential at the first control end;

the second output node control circuitry is electrically coupled to a second control end, the second clock signal end, a second output node, the first output node and the fourth clock signal end, and configured to write a second clock signal from the second clock signal end into a second control node under the control of a potential at the second control end, control the second control node to be electrically coupled to the second output node under the control of the second clock signal, write the fourth clock signal into the second output node under the control of the potential at the first output node, and adjust a potential at the second output end in accordance with the fourth clock signal;

the output circuitry is electrically coupled to the first output node, the second output node, the fourth clock signal end, the first voltage end and a gate driving signal output end, and configured to write the first voltage signal into the gate driving signal output end under the control of the potential at the first output node, and write the fourth clock signal into the gate driving signal output end under the control of the potential at the second output node; and the first output node control circuitry is electrically coupled to the first control end.

14. A display device comprising the gate driving circuit according to claim 13.

15. The gate driving circuit according to claim 13, wherein the first control end is the first output node; or the first control end is a first isolation node, the gate driving unit further comprises a first isolation circuitry, the first isolation node is electrically coupled to the first output node through the first isolation circuitry, a control end of the first isolation circuitry is electrically coupled to a first control voltage end, and the first isolation circuitry is configured to control the first control end to be electrically coupled to the first output node under the control of a first control voltage from the first control voltage end.

16. The gate driving circuit according to claim 15, wherein the first output node control circuitry comprises a first control end control sub-circuitry and a first output node control sub-circuitry;

the first control end control sub-circuitry is electrically coupled to a first node, a second node, the input end, the first clock signal end, the fourth clock signal end, the first voltage end and the first control end, and configured to control the first voltage end to be electrically coupled to the first node under the control of the input signal, control a potential at the first node in accordance with the input signal, control the first node to be electrically coupled to the second node under the control of the fourth clock signal, and control the second node to be electrically coupled to the first control end under the control of the first clock signal; and the first output node control sub-circuitry is electrically coupled to the second voltage end, the first control node, the third clock signal end and the first output node, and configured to write the second voltage signal from the second voltage end into the first output node under the control of the potential at the first control node and the third clock signal, and adjust the potential at the first output node in accordance with the third clock signal.

17. The gate driving circuit according to claim 16, wherein the first control end control sub-circuitry comprises a first node control transistor, a second node control transistor, a third node control transmission and a first capacitor;

a control electrode of the first node control transistor is electrically coupled to the input end, a first electrode of the first node control transistor is electrically coupled to the first voltage end, and a second electrode of the first node control transistor is electrically coupled to the first node;

a control electrode of the second node control transistor is electrically coupled to the fourth clock signal end, a first electrode of the second node control transistor is electrically coupled to the first node, and a second electrode of the second node control transistor is electrically coupled to the second node;

a first end of the first capacitor is electrically coupled to the input end, and a second end of the first capacitor is electrically coupled to the first node; and a control electrode of the third node control transistor is electrically coupled to the first clock signal end, a first electrode of the third node control transistor is electrically coupled to the second node, and a second electrode of the third node control transistor is electrically coupled to the first control end.

18. The gate driving circuit according to claim 16, wherein the first output node control sub-circuitry comprises a fourth node control transistor, a fifth node control transistor and a second capacitor;

a control electrode of the fourth node control transistor is electrically coupled to the first control node, and a first electrode of the fourth node control transistor is electrically coupled to the second voltage end;

a control electrode of the fifth node control transistor is electrically coupled to the third clock signal end, a first electrode of the fifth node control transistor is electrically coupled to a second electrode of the fourth node control transistor, and a second electrode of the fifth node control transistor is electrically coupled to the first output node; and a first end of the second capacitor is electrically coupled to the first output node, and a second end of the second capacitor is electrically coupled to the third clock signal end.

19. The gate driving circuit according to claim 15, wherein when the gate driving unit further comprises a first isolation circuitry, the first isolation circuitry comprises a first isolation transistor, a control electrode of the first isolation transistor is electrically coupled to the first control voltage end, a first electrode of the first isolation transistor is electrically coupled to the first control end, and a second electrode of the first isolation transistor is electrically coupled to the first output node.

20. The gate driving circuit according to claim 13, wherein the second control end is the first control node; or the second control end is a second isolation node, the gate driving unit further comprises a second isolation circuitry, a control end of the second isolation circuitry is electrically coupled to a second control voltage end, and the second isolation circuitry is configured to control the second control end to be electrically coupled to the first control node under the control of a second control voltage from the second control voltage end.

\* \* \* \* \*